United States Patent
Kim et al.

(10) Patent No.: US 11,587,634 B2
(45) Date of Patent: Feb. 21, 2023

(54) INTEGRATED CIRCUIT TEST APPARATUS

(71) Applicant: HYUNDAI AUTRON CO., LTD., Seoul (KR)

(72) Inventors: Yeon-Ho Kim, Seoul (KR); Keon Lee, Gwangju-si (KR); Ji-Hoon Lim, Gwangju-si (KR); Min-Ji Park, Seoul (KR); Jae-Hyuck Woo, Osan-si (KR); Yun-Ho Choi, Seoul (KR)

(73) Assignee: HYUNDAI MOBIS CO., LTD., Seoul (KR)

(*) Notice: Subject to any disclaimer, the term of this patent is extended or adjusted under 35 U.S.C. 154(b) by 194 days.

(21) Appl. No.: 16/691,029

(22) Filed: Nov. 21, 2019

(65) Prior Publication Data
US 2020/0168287 A1 May 28, 2020

(30) Foreign Application Priority Data
Nov. 26, 2018 (KR) .................. 10-2018-0147438

(51) Int. Cl.
 *G01R 31/3187* (2006.01)
 *G11C 29/12* (2006.01)
 *G01R 31/319* (2006.01)
 *G01R 31/3167* (2006.01)

(52) U.S. Cl.
 CPC ...... *G11C 29/1201* (2013.01); *G01R 31/3167* (2013.01); *G01R 31/3187* (2013.01); *G01R 31/31924* (2013.01)

(58) Field of Classification Search
None
See application file for complete search history.

(56) References Cited

U.S. PATENT DOCUMENTS

| | | | | |
|---|---|---|---|---|
| 6,353,563 B1* | 3/2002 | Hii | ................... | G11C 29/56012 714/39 |
| 6,438,721 B1* | 8/2002 | Wente | .................. | H03M 1/108 341/120 |
| 6,687,866 B2* | 2/2004 | Fukuda | .............. | G01R 31/2884 375/376 |
| 7,679,391 B2* | 3/2010 | Watanabe | .............. | G11C 29/56 324/750.3 |

(Continued)

FOREIGN PATENT DOCUMENTS

| | | |
|---|---|---|
| CN | 104078919 A | 10/2014 |
| JP | 08-315598 A | 11/1996 |

(Continued)

OTHER PUBLICATIONS

English translation of Komori et al JP 08315598A (Year: 1996).*

(Continued)

*Primary Examiner* — Jermele M Hollington
(74) *Attorney, Agent, or Firm* — Morgan, Lewis & Bockius LLP

(57) ABSTRACT

An integrated circuit test apparatus includes: a first test unit configured to output a current for a built-in self test (BIST) progress state for each internal circuit of an integrated circuit in a BIST test mode and to determine whether each internal circuit operates normally in a wake-up mode of the integrated circuit; and a first determination module configured to determine whether each internal circuit is in a stuck state based on a change detected by the first test unit.

7 Claims, 7 Drawing Sheets

(56) References Cited

U.S. PATENT DOCUMENTS

| 8,299,810 B2* | 10/2012 | Watanabe | G01R 31/318544 |
| | | | 324/755.01 |
| 2005/0034041 A1* | 2/2005 | Casarsa | G01R 31/3187 |
| | | | 714/733 |

FOREIGN PATENT DOCUMENTS

| JP | 2013-024569 A | 2/2013 |
| KR | 2003-0030891 A | 4/2003 |

OTHER PUBLICATIONS

Office Action dated Dec. 4, 2019 in the corresponding Korean Patent Application No. 10-2018-0147438, 6 pgs. . . .
Office Action issued in corresponding Chinese Patent Application No. 201911164590.0 dated Dec. 9, 2021, with English translation.

* cited by examiner

INTEGRATED CIRCUIT TEST APPARATUS

CROSS-REFERENCE TO RELATED APPLICATION

This application claims priority to and the benefit of Korean Patent Application No. 10-2018-0147438, filed on Nov. 26, 2018, the entire contents of which are incorporated herein by reference in its entirety.

TECHNICAL FIELD

The present disclosure relates to an integrated circuit test apparatus, and more particularly, to an integrated circuit test apparatus that tests a power-on reset (POR), an analog circuit, and a digital circuit of an integrated circuit.

BACKGROUND

The statements in this section merely provide background information related to the present disclosure and may not constitute prior art.

As the integration and the complexity of a circuit such as a semiconductor device increase rapidly, methods for examining or testing finished products also become more complicated. Various examination methods are provided to determine whether the produced products operate normally, and there is a design for testability (DFT) as a method that enables a test from a design stage.

As a representative method of the DFT, there is a scan method of checking operations of a combination circuit and a sequential circuit inside the device by inputting a test pattern from the outside of the device. This method is widely used because it can be automated by test software.

In a test method using the scan method, a test pattern is inputted to the semiconductor device by using test equipment and a test output signal is checked to determine whether there is an abnormality in the semiconductor device.

Meanwhile, in order to test the failure of the semiconductor device, a built-in self test (BIST) method having a test function is also widely used. In this method, a circuit for generating a test pattern and a circuit for compressing a response thereof are provided inside the device, so that it is possible to determine whether there is failure in the circuits without applying the test pattern from an exterior.

In the BIST method, the test circuit for generating the test pattern is provided in the semiconductor device to determine whether there is an abnormality in a functional circuit that performs the original function of the semiconductor device.

However, the related BIST method has a problem that it is not possible to know in detail an internal circuit where stuck has occurred among internal circuits of the semiconductor device. That is, since the semiconductor device is performing a reset operation (Reset Activate) during the BIST test, a signal outputted from the semiconductor device has an initial value and it is not possible to know information on the inside of the semiconductor device.

SUMMARY

In one form of the present disclosure, an integrated circuit test apparatus includes: a first test unit configured to output a current for a built-in self test (BIST) progress state according to the BIST progress state for each internal circuit of an integrated circuit in a BIST test mode for determining whether each internal circuit operates normally in a wake-up mode of the integrated circuit; and a first determination module configured to determine whether each internal circuit is in a stuck state according to a current detected by the first test unit according to the BIST progress state for each internal circuit.

The first test unit includes: a reset pin; a reset switch connected in series with the reset pin, switched according to a reset signal, and configured to allow a current to flow through the reset pin; current sources configured to output currents for the BIST progress state for each internal circuit; and test switches disposed in parallel, individually switched according to a test control signal for each internal circuit, and configured to allow the currents for the BIST progress state to be outputted through the current sources, wherein the first test unit measures the current for the BIST progress state, which flows through the reset pin, and determines whether each internal circuit is in the stuck state.

The first determination module includes: a first state detection unit configured to detect the current for the BIST progress state through the reset pin; and a first stuck determination unit configured to determine whether each internal circuit is in the stuck state by using the current for the BIST progress state detected by the first state detection unit.

The first stuck determination unit determines whether each internal circuit is stuck, based on change and duration of the current for the BIST progress state detected by the first state detection unit.

The first stuck determination unit determines whether the current detected by the first state detection unit is continued for a preset time or more within a preset current setting range, and determines whether each internal circuit is in the stuck state according to a result of the determination.

In another form of the present disclosure, an integrated circuit test apparatus includes: a second test unit configured to output a logic signal according to a consumption current consumed for each internal circuit of an integrated circuit during a built-in self test (BIST) test for each internal circuit in a BIST test stage for determining whether each internal circuit operates normally in a wake-up mode of the integrated circuit; and a second determination module configured to determine whether each internal circuit is stuck, based on a change in a current detected by the second test unit.

The second test unit includes: a power supply section configured to supply power to the internal circuit; a consumption current measurement section configured to output a voltage according to the consumption current consumed in the internal circuit; a first comparison section configured to compare the voltage inputted from the consumption current measurement section with a preset first reference voltage and output any one of a high signal and a low signal; a second comparison section configured to compare the voltage inputted from the consumption current measurement section with a preset second reference voltage and output any one of a high signal and a low signal; and an output section configured to output the high signal or the low signal outputted from the first comparison section and the second comparison section.

The output section includes: a first multiplexer configured to output any one of the high signal and the low signal, which are outputted from the first comparison section, through a first pin when a current mode is a BIST mode and to output the low signal through the first pin when the current mode is not the BIST mode; and a second multiplexer configured to output any one of the high signal and the low signal, which are outputted from the second comparison section, through a second pin when the current mode is the BIST mode and to output the low signal through the second pin when the current mode is not the BIST mode.

The second determination module includes: a second state detection unit configured to detect the logic signal outputted from the second test unit; and a second stuck determination unit configured to determine whether each internal circuit is in a stuck state according to the logic signal detected by the second state detection unit.

The second stuck determination unit determines whether each internal circuit is stuck, based on change and duration of the logic signal for the BIST progress state detected by the second state detection unit.

The second stuck determination unit determines whether the logic signal detected by the second state detection unit is continued for a preset time or more, and determines whether each internal circuit is in the stuck state according to a result of the determination.

The integrated circuit test apparatus in accordance with an form of the present disclosure can determine whether a power-on reset (POR), an analog circuit, and a digital circuit of an integrated circuit are in a stuck state in a wake-up stage before the integrated circuit enters an operation mode.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
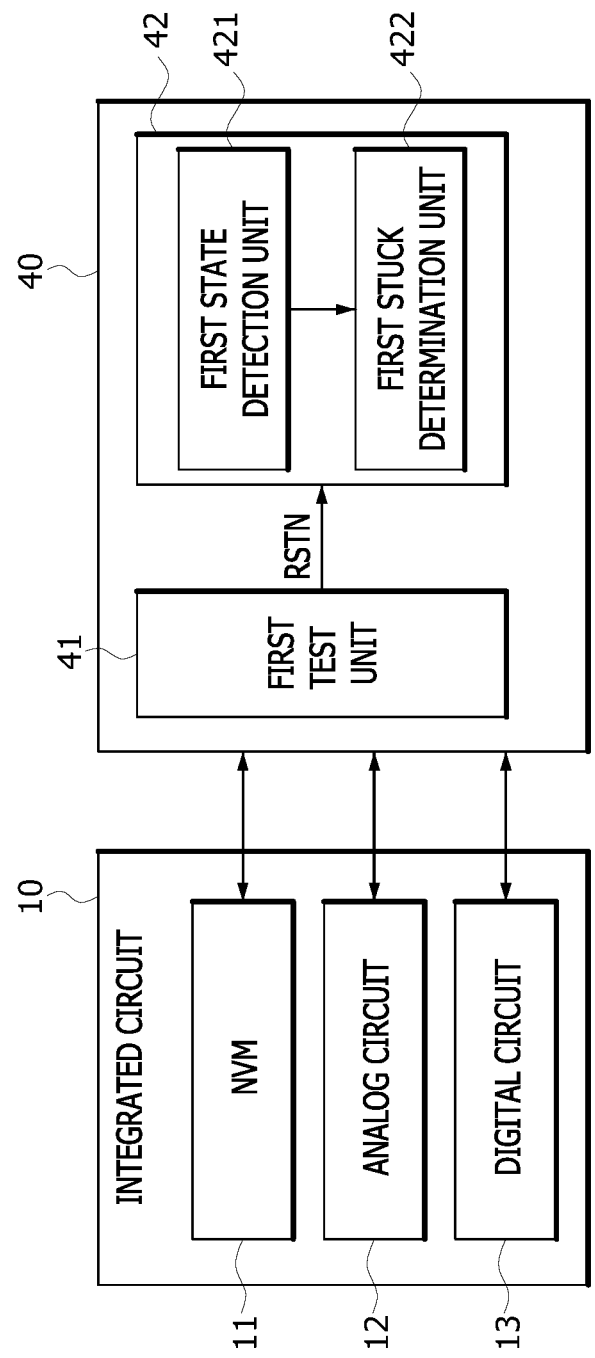
FIG. 1 is a block configuration diagram of an integrated circuit test apparatus in one form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

As is traditional in the corresponding field, some forms of the present disclosure may be illustrated in the drawings in terms of functional blocks, units, and/or modules. Those of ordinary skill in the art will appreciate that these block, units, and/or modules are physically implemented by electronic (or optical) circuits such as logic circuits, discrete components, processors, hard-wired circuits, memory elements, wiring connections, and the like. When the blocks, units, and/or modules are implemented by processors or similar hardware, they may be programmed and controlled using software (e.g., code) to perform various functions discussed herein. Alternatively, each block, unit, and/or module may be implemented by dedicated hardware or as a combination of dedicated hardware to perform some functions and a processor (e.g., one or more programmed processors and associated circuitry) to perform other functions. Each block, unit, and/or module of in some forms of the present disclosure may be physically separated into two or more interacting and discrete blocks, units, and/or modules without departing from the scope of the inventive concept. Further, blocks, units, and/or module in some forms of the present disclosure may be physically combined into more complex blocks, units, and/or modules without departing from the scope of the inventive concept.

Hereinafter, an integrated circuit test apparatus in some forms of the present disclosure will be described in detail with reference to the accompanying drawings. It should be noted that the drawings are not to precise scale and may be exaggerated in thickness of lines or sizes of components for descriptive convenience and clarity only. Furthermore, the terms as used herein are defined by taking functions of the disclosure into account and can be changed according to the custom or intention of users or operators. Therefore, definition of the terms should be made according to the overall disclosures set forth herein.

Figure 2:
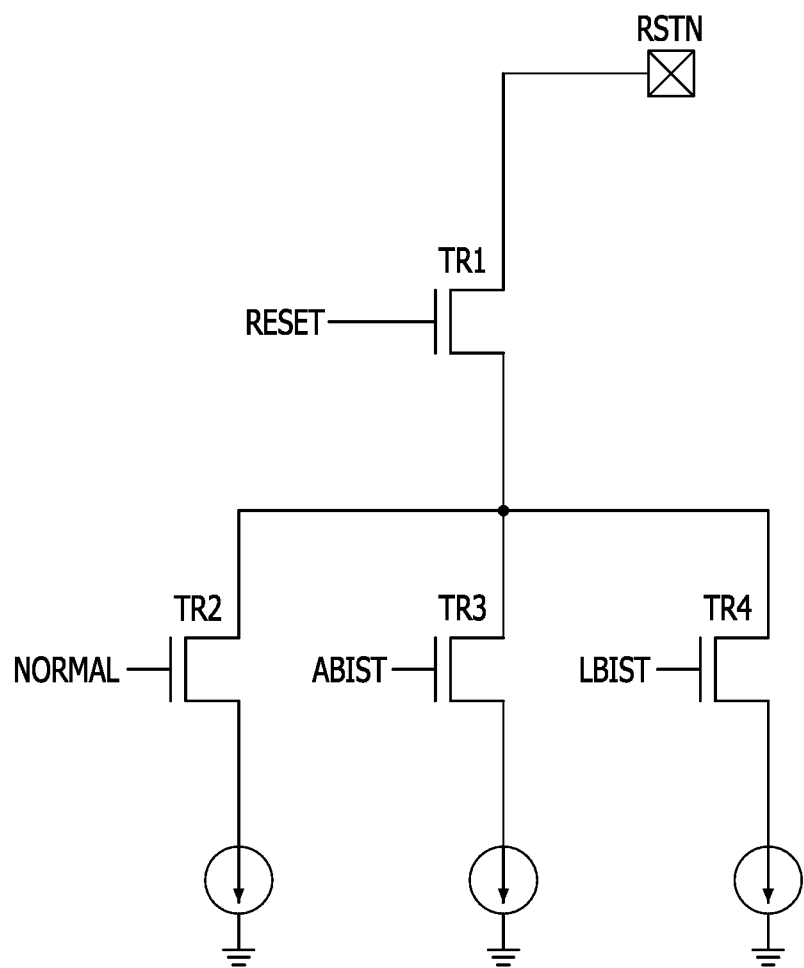
FIG. 2 is a circuit diagram of a first test unit in accordance with the first form of the present disclosure.
Figure 3:
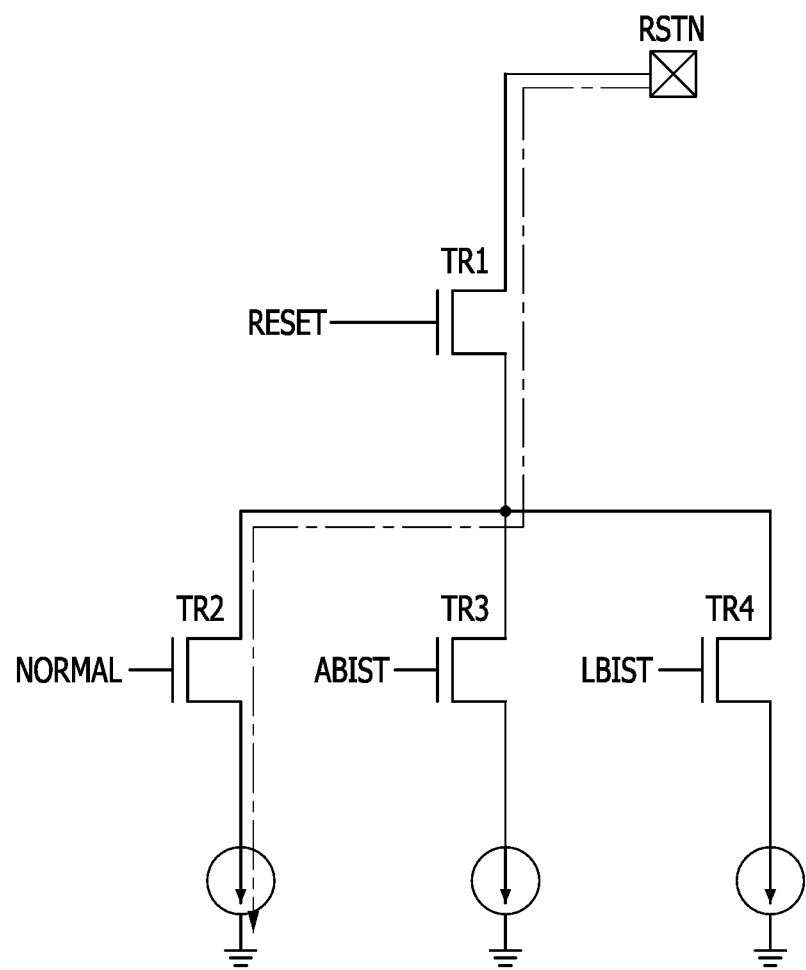
FIG. 3, FIG. 4 and FIG. 5 are diagrams illustrating the current flow of the first test unit in one form of the present disclosure.
Figure 4:
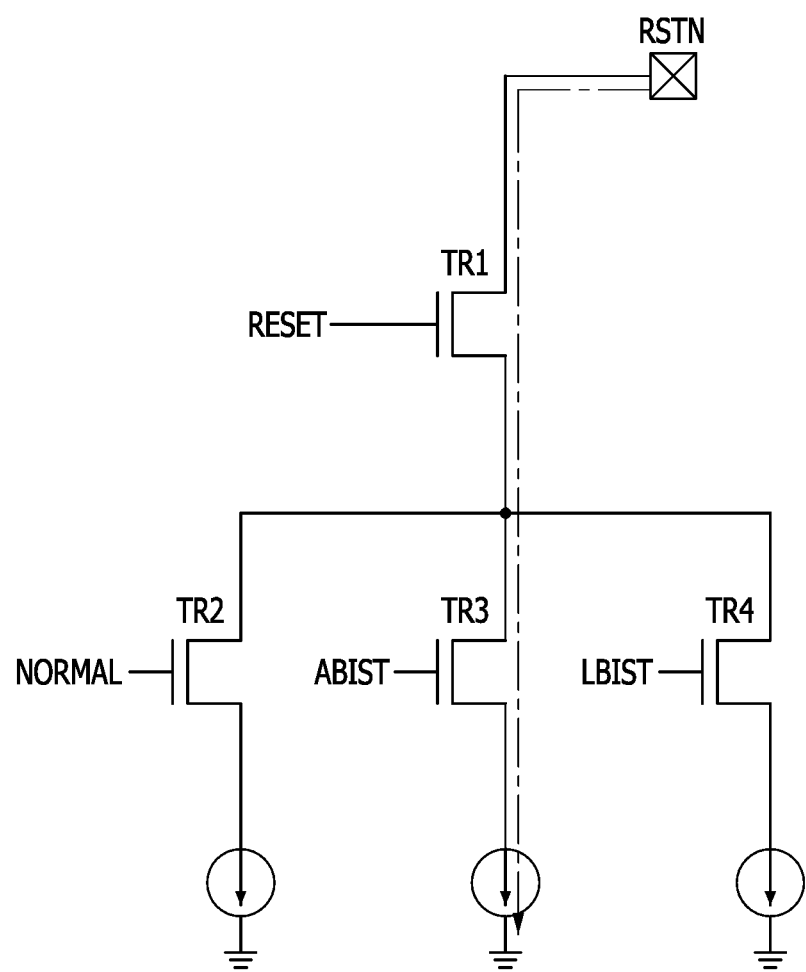
Figure 5:
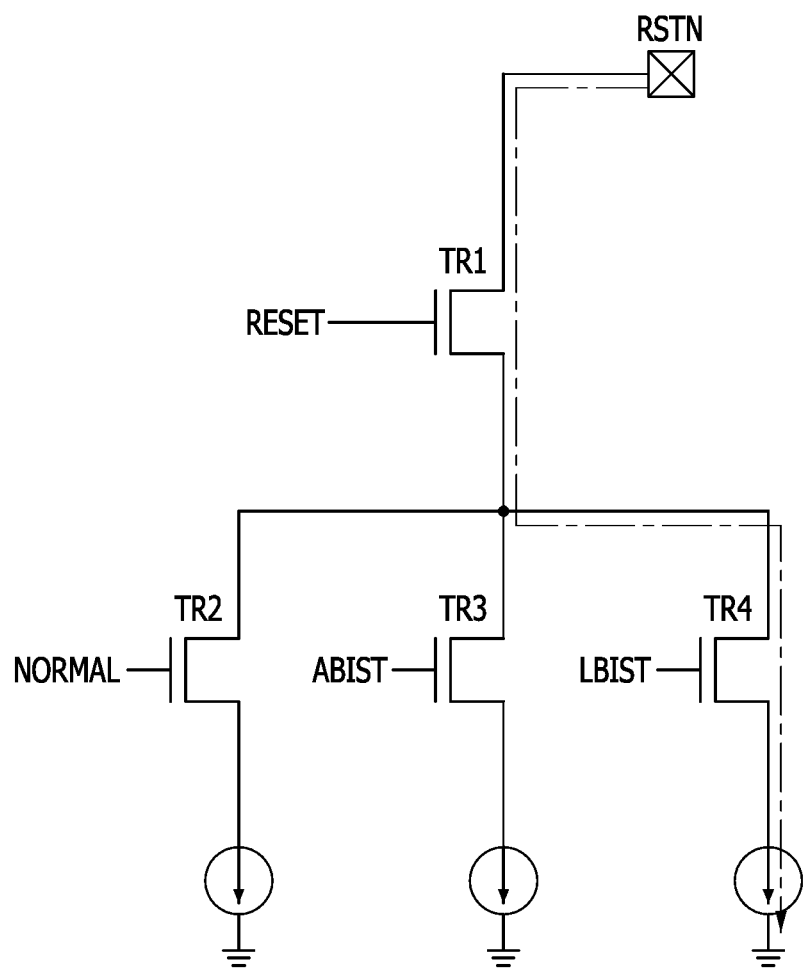

FIG. 1 is a block configuration diagram of an integrated circuit test apparatus in some forms of the present disclosure, FIG. 2 is a circuit diagram of a first test unit in some forms of the present disclosure, and FIG. 3 to FIG. 5 are diagrams illustrating the current flow of the first test unit in some forms of the present disclosure.

Referring to FIG. 1, an integrated circuit test apparatus 40 in some forms of the present disclosure is installed outside an integrated circuit 10 to perform a built-in self test (BIST) test on the integrated circuit 10 in a wake-up stage before the integrated circuit 10 enters an operation mode.

In some forms of the present disclosure, a case where the integrated circuit test apparatus 40 is installed outside the integrated circuit 10 is described as an example; however, the technical scope of the present disclosure is not limited thereto and the integrated circuit test apparatus 40 may be installed inside the integrated circuit 10.

The integrated circuit 10 includes a nonvolatile memory (NVM) 11, an analog circuit 12, and a digital circuit 13 therein. The NVM 11 stores information for ensuring analog circuit performance, and the analog circuit 12 supplies power into the integrated circuit 10 or drives elements outside the integrated circuit 10. The digital circuit 13 may include a communication interface or an analog block control circuit.

The integrated circuit test apparatus 40 includes a first test unit 41 and a first determination module 42.

The first test unit 41 outputs a current for a built-in self test (BIST) progress state according to the BIST progress state for each internal circuit of the integrated circuit 10 in a BIST test mode for determining whether each internal circuit operates normally in the wake-up mode of the integrated circuit 10.

The first test unit 41 includes a reset pin RSTN, a reset switch TR1, current sources, and test switches TR2 to TR4 as illustrated in FIG. 2.

The reset pin RSTN outputs the current for the BIST progress state by the first test unit 41. During the BIST, different currents may be outputted from the integrated circuit 10. That is, during a power-on reset (POR) operation and in a state of analog circuit test and digital circuit test, different currents are outputted in respective progress states, and the reset pin RSTN outputs the current for the BIST progress state. As described above, as the current for the BIST progress state is outputted through the reset pin RSTN, the first determination module 42 determines whether a stuck has occurred in each BIST progress state through the current.

Typically, in a self-test process for the internal circuit in the integrated circuit 10 after the integrated circuit 10 is powered on, when the internal circuit is stuck, there is no information on a stage in which the BIST test has stopped. During the BIST test, since the integrated circuit 10 is performing a reset operation (Reset Activate), a signal outputted from the integrated circuit 10 has an initial value, so that it is not possible to know information on the inside of the integrated circuit 10.

In this regard, in some forms of the present disclosure, it is determined whether a stuck has occurred in each BIST test stage, based on a signal outputted from each BIST progress stage.

The reset switch TR1 is connected in series with the reset pin RSTN and is switched according to a reset signal RESET to allow a current to flow through the reset pin RSTN. The reset switch TR1 has a drain connected to the reset pin RSTN and a source connected to drains of the test switches TR2 to TR4 to be described later, and is switched by receiving the reset signal RESET through the gate thereof.

The current sources are provided in a plural number according to the BIST test stage and each current source outputs a current for the BIST progress state for each internal circuit. The currents flowing through the current sources are different from one another. The current source is connected to the ground through one side thereof, is connected to the source of each of the test switches TR2 to TR4 through the other side thereof, and outputs a current according to the switching state of each of the test switches TR2 to TR4.

For example, the current source connected to the test switch TR2 may output 1 mA, the current source connected to the test switch TR3 may output 2 mA, and the current source connected to the test switch TR4 may output 3 mA.

The test switches TR2 to TR4 are provided in a plural number according to the BIST test stage and are disposed in parallel with one another. The test switches TR2 to TR4 have drains connected to the source of the reset switch and sources connected in series to the current sources, and are selectively switched according to the BIST test stage by receiving signals according to the BIST test stage through the gates thereof, for example, signals NORMAL, ABIST, and LBIST.

For example, in a POR stage of the BIST test stage, the signal NORMAL is inputted and the test switch TR2 is turned on (the test switch TR3 and the test switch TR4 are turned off). In an analog circuit test stage, the signal ABIST is inputted and the test switch TR3 is turned on (the test switch TR2 and the test switch TR4 are turned off). In a digital circuit test stage, the signal LBIST is inputted and the test switch TR4 is turned on (the test switch TR2 and the test switch TR3 are turned off).

In such a case, when the integrated circuit 10 is reset, a current flowing through the reset pin, that is, a current for the BIST test stage flows differently according to the BIST test state of the integrated circuit 10.

For example, during NORMAL driving, as illustrated in FIG. 3, the test switch TR2 is turned on (the test switch TR3 and the test switch TR4 are turned off) by the signal NORMAL and at this time, when the reset signal RESET is inputted to the reset switch TR1 due to the occurrence of reset, the reset switch TR1 is turned on. Accordingly, a current of 1 mA flows through the reset pin RSTN by the current source connected to the test switch TR2.

In the analog circuit BIST stage, as illustrated in FIG. 4, the test switch TR3 is turned on (the test switch TR2 and the test switch TR4 are turned off) by the signal ABIST and at this time, when the reset signal RESET is inputted to the reset switch TR1 due to the occurrence of reset, the reset switch TR1 is turned on. Accordingly, a current of 2 mA flows through the reset pin RSTN by the current source connected to the test switch TR2.

In the digital circuit BIST stage, as illustrated in FIG. 5, the test switch TR4 is turned on (the test switch TR2 and the test switch TR3 are turned off) by the signal LBIST and at this time, when the reset signal RESET is inputted to the reset switch TR1 due to the occurrence of reset, the reset switch TR1 is turned on. Accordingly, a current of 3 mA flows through the reset pin RSTN by the current source connected to the test switch TR2.

That is, different currents flow through the reset pin according to each BIST test stage.

The first determination module 42 includes a first state detection unit 421 and a first stuck determination unit 422.

The first state detection unit 421 detects a current for the BIST progress state through the reset pin RSTN.

The first stuck determination unit 422 determines whether each internal circuit is in a stuck state by using the current for the BIST progress state detected by the first state detection unit 421. In such a case, the first stuck determination unit 422 determines whether each circuit is stuck based on change and duration of the current for the BIST progress state detected by the first state detection unit 421. Specifically, the first stuck determination unit 422 determines whether the current detected by the first state detection unit 421 is continued for a preset time or more within a preset current setting range and determines whether each internal circuit is in the stuck state according to a result of the determination.

For example, when the BIST test is performed in the order of the POR, the analog circuit test, and the digital circuit test, the first stuck determination unit 422 determines that a stuck has occurred in the POR test state when a current detected by the reset pin RSTN is continued at 1 mA for the preset time or more, determines that a stuck has occurred in the analog circuit test state when the current detected by the reset pin RSTN is continued at 2 mA for the preset time or more, and determines that a stuck has occurred in the digital circuit test state when the current detected by the reset pin RSTN is continued at 3 mA for the preset time or more.

Hereinafter, an integrated circuit test apparatus in some forms of the present disclosure will be described in detail with reference to FIG. 6 and FIG. 7.

Figure 6:
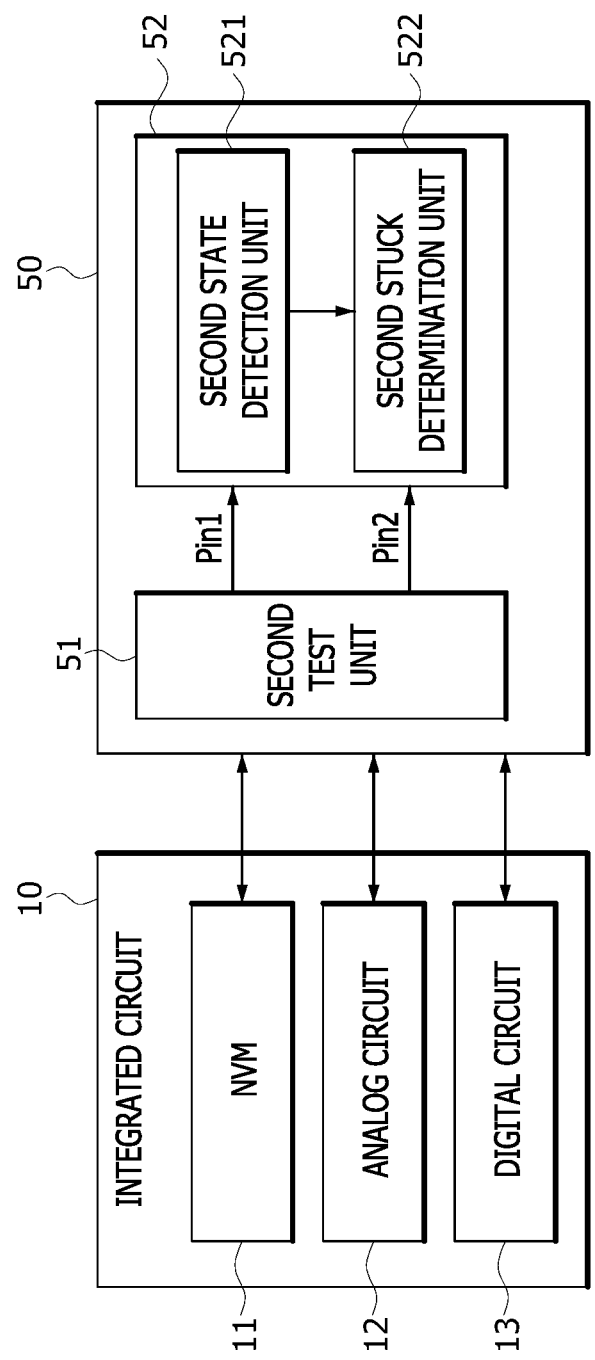
FIG. 6 is a block configuration diagram of an integrated circuit test apparatus in one form of the present disclosure.
Figure 7:
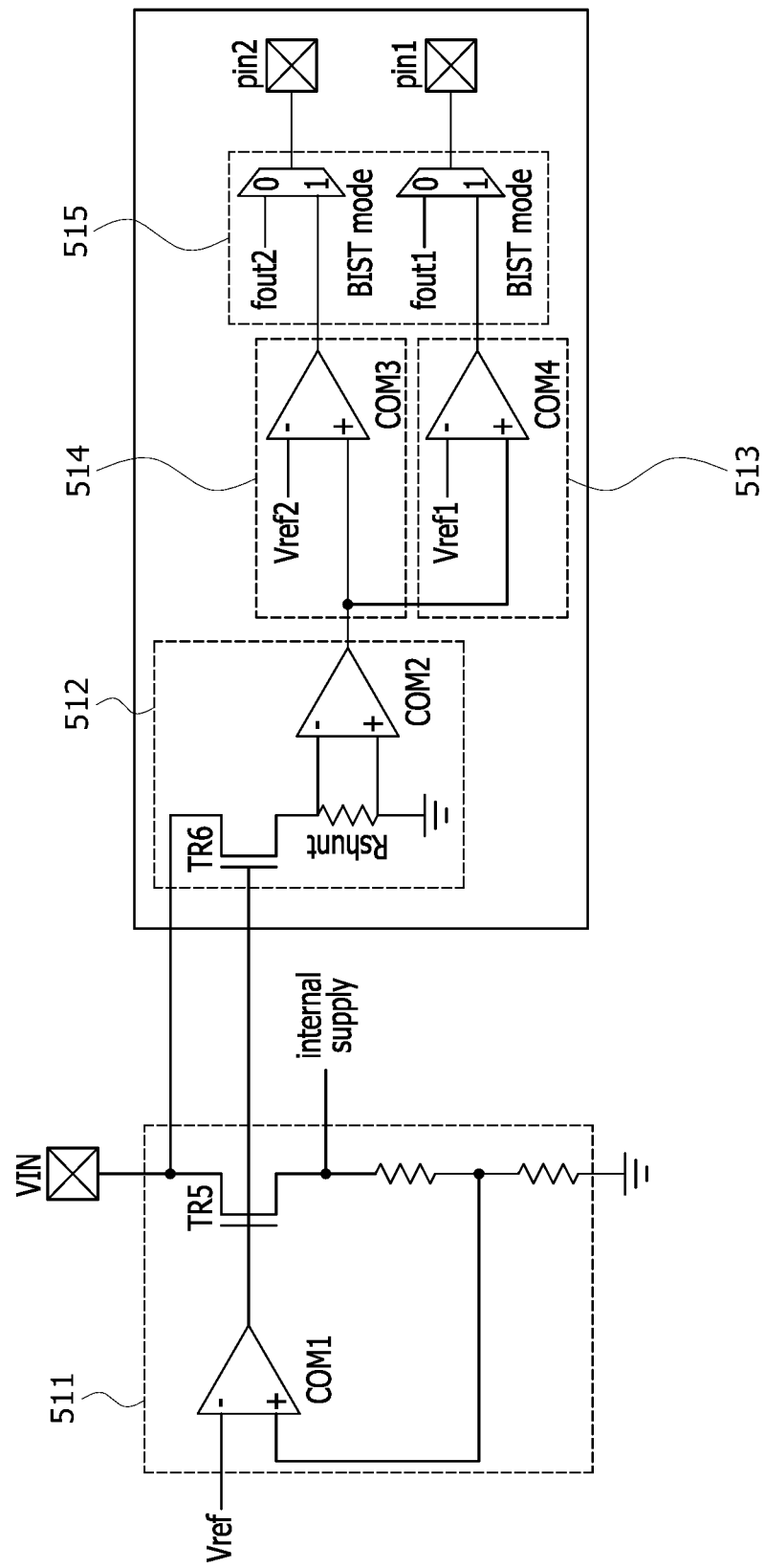
FIG. 7 is a circuit diagram of a second test unit in one form of the present disclosure.

FIG. 6 is a block configuration diagram of the integrated circuit test apparatus in some forms of the present disclosure, and FIG. 7 is a circuit diagram of a second test unit in some forms of the present disclosure.

Referring to FIG. 6, an integrated circuit test apparatus 500 in some forms of the present disclosure includes a second test unit 51 and a second determination module 52.

The second test unit 51 outputs a logic signal according to a consumption current consumed for each internal circuit of the integrated circuit 10 during a built-in self test (BIST) test for each internal circuit in a BIST test stage for determining whether each internal circuit operates normally in the wake-up mode of the integrated circuit 10.

Referring to FIG. 7, the second test unit 51 includes a power supply section 511, a consumption current measurement section 512, a first comparison section 513, a second comparison section 514, and an output section 515.

The power supply section 511 supplies power to the internal circuit of the integrated circuit 10. A power switch TR5 of the power supply section 511 has a drain connected to a power supply VIN, a source connected to a first resistor R1 and a second resistor R2 connected in series with each other, and a gate connected to the output of a first comparator COM1.

A reference voltage Vref is inputted to an inverting terminal of the first comparator COM1, a divided voltage formed between the first resistor R1 and the second resistor R2 is inputted to a non-inverting terminal thereof, and the first comparator COM1 compares the reference voltage Vref with the divided voltage to input its output to the gate of the power switch TR5.

When the power switch TR5 is turned on according to the voltage applied to the gate, the power VIN is supplied to a power source of the internal circuit (Internal Supply).

The consumption current measurement section 512 outputs a voltage according to the consumption current consumed in the internal circuit. The consumption current measurement section 512 is a current mirror circuit of the power supply section 511 and includes a current mirror switch TR6, a shunt resistor Rshunt, and a second comparator COM2.

The current mirror switch TR6 has a drain connected to the power supply VIN, a gate connected to the output of the first comparator COM1, and a source connected to the shunt resistor Rshunt. Accordingly, the current mirror switch TR6 is turned on according to the output of the first comparator COM1.

One end of the shunt resistor Rshunt is connected to a non-inverting terminal and an inverting terminal of the second comparator COM2, a current flowing through the current mirror switch TR6 appears as a voltage difference by the shunt resistor Rshunt, and such a voltage is outputted through the second comparator COM2.

The first comparison section 513 outputs a voltage according to the consumption current consumed in the internal circuit. The first comparison section 513 compares the output voltage of the second comparator COM2 inputted to a non-inverting terminal thereof and a reference voltage Vref1 inputted to an inverting terminal thereof, and outputs any one of a high signal and a low signal.

The second comparison section 514 outputs a voltage according to the consumption current consumed in the internal circuit. The second comparison section 514 compares the output voltage of the second comparator COM2 inputted to a non-inverting terminal thereof and a reference voltage Vref2 inputted to an inverting terminal thereof, and outputs any one of a high signal and a low signal.

The output section 515 outputs the high signal or the low signal respectively outputted from the first comparison section 513 and the second comparison section 514.

The output section 515 includes a first multiplexer MUX and a second multiplexer.

The first multiplexer receives the output of the second comparator COM2 and a signal from a function output terminal fout1 of the integrated circuit 10, and outputs input from the first comparison section 513 through a first pin Pin1 according to whether the current mode is a BIST mode. In such a case, the first multiplexer outputs the input from the first comparison section 513 when the current mode is the BIST mode and outputs the signal from the function output terminal fout1 when the current mode is not the BIST mode.

The second multiplexer receives the output of the second comparator COM2 and a signal from a function output terminal fout2 of the integrated circuit 10, and outputs input from the second comparison section 514 through a second pin Pin2 according to whether the current mode is the BIST mode. In such a case, the second multiplexer outputs the input from the second comparison section 514 when the current mode is the BIST mode and outputs the signal from the function output terminal fout2 when the current mode is not the BIST mode.

Accordingly, when the current mode is the BIST mode, each of the first pin Pin1 and the second pin Pin2 outputs any one of the high signal or the low signal inputted from the first comparison section 513 and the second comparison section 514.

Typically, a current consumed for each BIST test stage is less than 2 mA in the POR state, is 4 mA or more and 8 mA or less in the analog circuit test state, and is 20 mA or more and 24 mA or less in the digital circuit test state.

In such a case, when the current of the reference voltage Vref1 is set to 3 mA and the current of the reference voltage Vref2 is set to 15 mA, the low signal is outputted through the first pin Pin1 and the high signal is outputted through the second pin Pin2 in the POR state, the high signal is outputted through the first pin Pin1 and the low signal is outputted through the second pin Pin2 in the analog circuit test state, and the high signal is outputted through the first pin Pin1 and the high signal is outputted through the second pin Pin2 in the digital circuit test state.

The second determination module 52 determines whether each internal circuit is stuck, based on a change in the current detected by the second test unit 51, and determines whether each internal circuit is stuck, based on a change in the logic signal outputted through the first pin Pin1 and the second pin Pin2 according to the consumption current in each BIST test state as described above.

The second determination module 52 includes a second state detection unit 521 and a second stuck determination unit 522.

The second state detection unit 521 detects logic signals inputted through the first pin Pin1 and the second pin Pin2, respectively.

The second stuck determination unit 522 determines whether each internal circuit is in a stuck state according to the logic signals detected by the second state detection unit 521.

In such a case, the second stuck determination unit 522 determines whether each internal circuit is stuck, based on change and duration of the logic signal for the BIST progress state, which has been detected by the second state detection unit 521. Specifically, the second stuck determination unit 522 determines whether the logic signal detected by the second state detection unit 521 is continued for a preset setting time or more and determines whether each internal circuit is in the stuck state according to a result of the determination.

That is, when the state, in which the low signal is detected through the first pin Pin1 and the high signal is detected through the second pin Pin2 by the second state detection unit 521, is continued for the preset setting time or more, the second stuck determination unit 522 determines that stuck has occurred in the POR state. When the state, in which the high signal is detected through the first pin Pin1 and the low signal is detected through the second pin Pin2 by the second state detection unit 521, is continued for the preset setting time or more, the second stuck determination unit 522 determines that stuck has occurred in the analog circuit test state. When the state, in which the high signal is detected through the first pin Pin1 and the high signal is detected through the second pin Pin2 by the second state detection unit 521, is continued for the preset setting time or more, the second stuck determination unit 522 determines that stuck has occurred in the digital circuit test state.

As described above, the integrated circuit test apparatus in some forms of the present disclosure can determine whether each of the POR, the analog circuit 12, and the digital circuit 13 of the integrated circuit 10 is in a stuck state in the wake-up stage before the integrated circuit 10 enters an operation mode.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. An integrated circuit test apparatus comprising:
   (a) a test unit comprising:
      (i) a first comparison section configured to:
         compare a voltage corresponding to a consumption current consumed by each internal circuit of an integrated circuit with a preset first reference voltage; and
         output a first signal that is a high signal or a low signal;
      (ii) a second comparison section configured to:
         compare the voltage corresponding to the consumption current with a preset second reference voltage;
         output a second signal that is a high signal or a low signal; and
      (iii) an output section configured to output the first signal and the second signal,
      wherein the test unit is configured to:
         output a logic signal corresponding to the consumption current for each of the internal circuit during a built-in self test (BIST) for each internal circuit in a BIST stage; and
         determine whether each of the internal circuit operates normally in a wake-up mode of the integrated circuit; and
   (b) a determination module configured to determine whether each of the internal circuit is in a stuck state based on a change in a current detected by the test unit.

2. The integrated circuit test apparatus of claim 1, wherein the test unit further comprises:
   (iv) a power supply section configured to supply power to each of the internal circuit; and
   (v) a consumption current measurement section configured to output the voltage corresponding to the consumption current.

3. The integrated circuit test apparatus of claim 1, wherein the output section further comprises:
   a first multiplexer configured to:
      output the first signal through a first pin when a current mode is a BIST mode; and
      output the first signal that is the low signal through the first pin when the current mode is not the BIST mode; and
   a second multiplexer configured to:
      output the second signal through a second pin when the current mode is the BIST mode; and
      output the second signal that is the low signal through the second pin when the current mode is not the BIST mode.

4. The integrated circuit test apparatus of claim 1, wherein the determination module further comprises:
   a state detection unit configured to detect the logic signal outputted from the test unit; and
   a stuck determination unit configured to determine whether each internal circuit is in the stuck state based on the detected logic signal.

5. The integrated circuit test apparatus of claim 4, wherein the stuck determination unit is further configured to:
   determine whether each internal circuit is in the stuck state based on a change and a duration of the detected logic signal.

6. The integrated circuit test apparatus of claim 5, wherein the stuck determination unit is further configured to:
   determine whether the detected logic signal is continued for a predetermined amount of time; and
   determine whether each internal circuit is in the stuck state based on whether the detected logical signal is continued for the predetermined amount of time.

7. An integrated circuit test apparatus comprising:
   (a) a test unit comprising:
      a comparator configured to:
         compare a voltage corresponding to a consumption current consumed by an internal circuit of an integrated circuit with a preset reference voltage;
         output a logic signal that is a high signal or a low signal;
      wherein the test unit is configured to:
         output the logic signal corresponding to the consumption current of the internal circuit during a built-in self test (BIST) for the internal circuit in a BIST stage; and
         determine whether the internal circuit operates normally in a wake-up mode of the integrated circuit; and
   (b) a determination module configured to determine whether the internal circuit is in a stuck state based on a change in a current detected by the test unit,
   wherein the determination module determines whether the internal circuit is in the stuck state based on a change and a duration of the logic signal.

* * * * *